US 7,653,367 B2

(12) United States Patent
Song et al.

(10) Patent No.: US 7,653,367 B2
(45) Date of Patent: Jan. 26, 2010

(54) SQUELCH DETECTOR

(75) Inventors: Hongjiang Song, Mesa, AZ (US);
Yueming He, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 572 days.

(21) Appl. No.: 11/394,937

(22) Filed: Mar. 30, 2006

(65) Prior Publication Data
US 2007/0238429 A1 Oct. 11, 2007

(51) Int. Cl.
*H04B 1/10* (2006.01)
*H04B 1/18* (2006.01)

(52) U.S. Cl. .................. 455/218; 455/212; 455/222; 455/283; 455/296

(58) Field of Classification Search .............. 455/212, 455/214, 218–225, 296, 283–285, 302
See application file for complete search history.

(56) References Cited

U.S. PATENT DOCUMENTS

| 3,851,253 | A | * | 11/1974 | Eastmond | 455/212 |
|---|---|---|---|---|---|
| 4,922,549 | A | * | 5/1990 | Johnson et al. | 455/212 |
| 5,179,577 | A | * | 1/1993 | Ilyadis | 375/317 |
| 5,303,407 | A | * | 4/1994 | Juergensen et al. | 455/222 |
| 5,450,622 | A | * | 9/1995 | Vandegraaf | 455/222 |
| 5,465,404 | A | * | 11/1995 | Retzer et al. | 455/220 |
| 6,055,421 | A | * | 4/2000 | Zele et al. | 455/218 |
| 6,208,848 | B1 | * | 3/2001 | Bertrana | 455/218 |
| 6,859,645 | B2 | * | 2/2005 | Yu | 455/222 |
| 7,120,408 | B2 | * | 10/2006 | Wood | 455/218 |
| 7,218,903 | B2 | * | 5/2007 | Komatsu et al. | 455/218 |
| 2007/0173216 | A1 | * | 7/2007 | Blum | 455/212 |

* cited by examiner

*Primary Examiner*—Simon D Nguyen
(74) *Attorney, Agent, or Firm*—Lee & Hayes, PLLC

(57) ABSTRACT

A squelch detector that differentially detects a presence of a communication signal on a communication channel. The squelch detector being coupled to outputs of a differential offset bias amplifier to receive differential offset biased signals and generate a differential direct current signal.

21 Claims, 6 Drawing Sheets

SQUELCH DETECTOR

BACKGROUND

When communication components in systems and devices are not sending and/or receiving information, the unused circuits may be turned off to conserve power. In one technique, a squelch detector is utilized to monitor the power level of signals on the communication channel. When the power level of the communication signal drops below a given level, the squelch detector powers down the unused circuits.

BRIEF DESCRIPTION OF THE DRAWINGS

Embodiments are illustrated by way of example and not by way of limitation, in the figures of the accompanying drawings and in which like reference numerals refer to similar elements and in which.

DETAILED DESCRIPTION

In the following discussion, an exemplary environment is described which is operable to employ a squelch detector, along with exemplary squelch detectors which may be utilized by systems and devices to detect communication signals on a communication channel. Exemplary circuits of the squelch detector are also described which may be employed in the systems and devices, as well as in other systems and devices. Exemplary methods are also described which may also be employed by the systems and devices, as well as in other systems and devices.

Exemplary Environment

Figure 1:
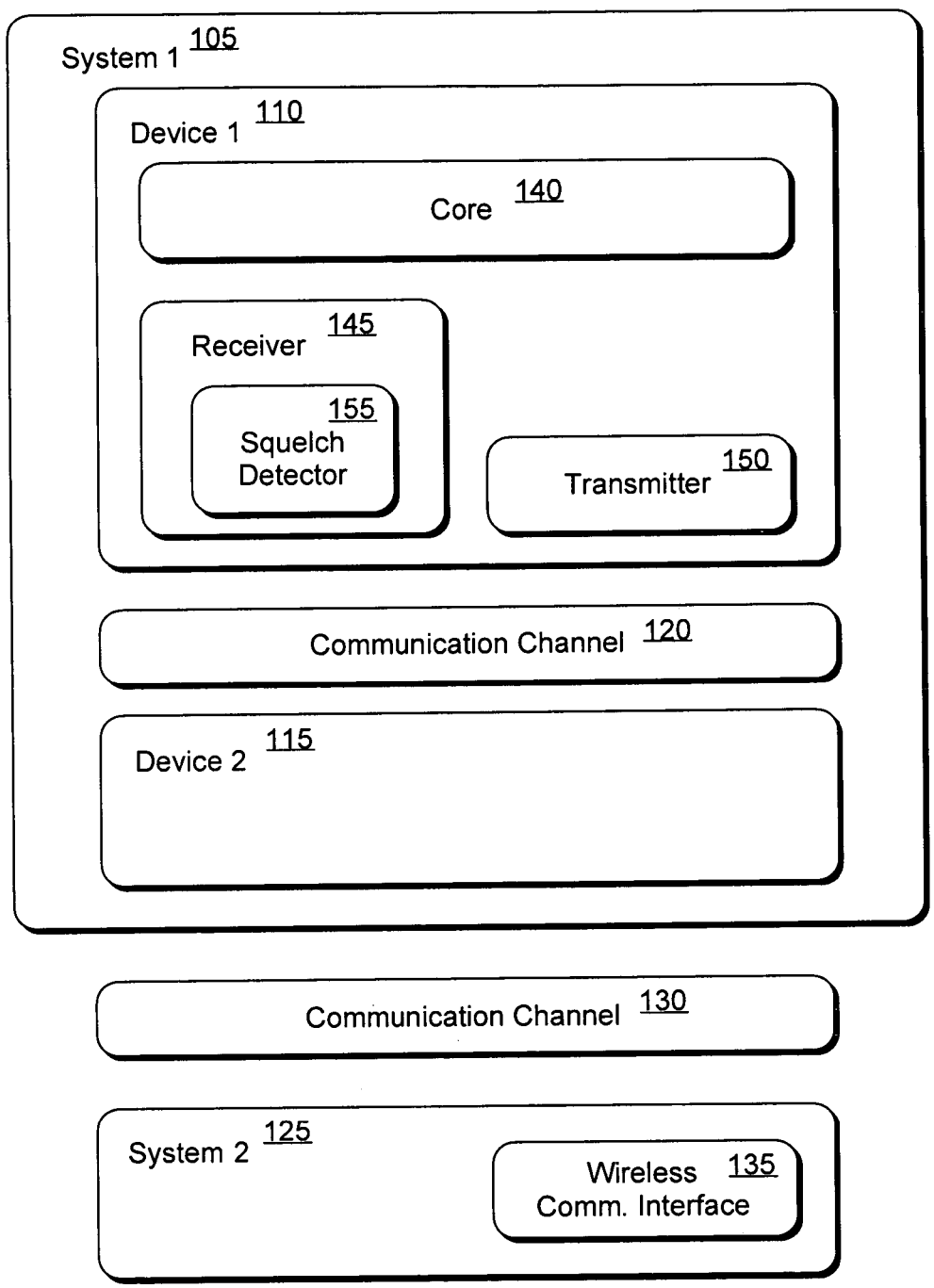
FIG. 1 shows a block diagram of an exemplary environment which may provide and/or utilize a squelch detector.

FIG. 1 shows an exemplary environment 100 which may provide and/or utilize a squelch detector. The exemplary environment may include a system 105 having one or more devices (illustrated as devices 110, 115) internally coupled by one or more communication channels (an example of which is illustrated as communication channel 120). The communication channels 120 may be data communication links, such as for example a universal serial bus (USB) link, a USB2 link, a serial advanced technology attachment (ATA) link, a peripheral component interconnect (PCI) link; PCI express link, Firewire (IEEE 1394) link and/or the like. The system 105 may also be coupled to one or more other systems (illustrated as system 125) by one or more external communication channels (an example of which is illustrated as communication channel 130). The external communication channel 130 may be a wireless link. If the communication channel 130 is a wireless link, the systems may be coupled to the communication channel 130 by a wireless communication interface 135 (an example of which is illustrated as system 125).

Each device (illustrated as device 110) includes a core circuit 140 to implement the function of the device 110. Each device that is communicatively coupled to a communication channel 120, 130, also includes a receiver circuit 145 and transmitter circuit 150 (an example of which is illustrated as device 110). One or more of the devices may also include a squelch detector 155 (an example of which is illustrated as device 110) to detect signals on the communication channels 120, 130. In a receiver 145, the squelch detector 155 provides an input signal power level monitoring function to identify if there is a valid signal on the communication channel 120, 130. Accordingly, the squelch detector 155 may be utilized to opportunistically power-down unused circuits to save power if a valid signal is not present on the communication channel 120, 130.

Exemplary Squelch Detector

Figure 2:
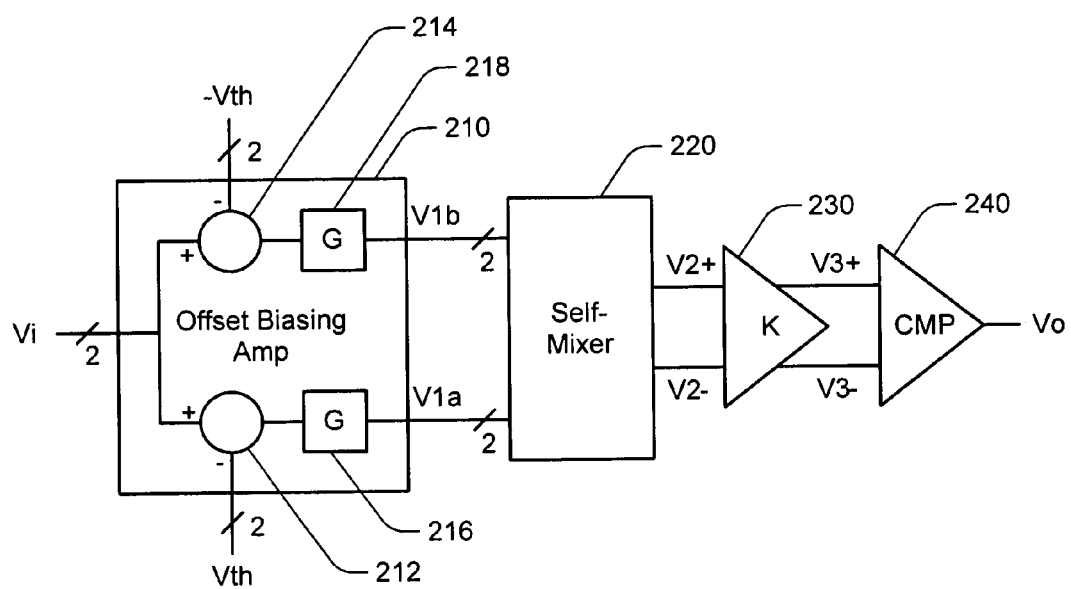
FIG. 2 shows a block diagram of a squelch detector in an exemplary implementation.
Figure 3:
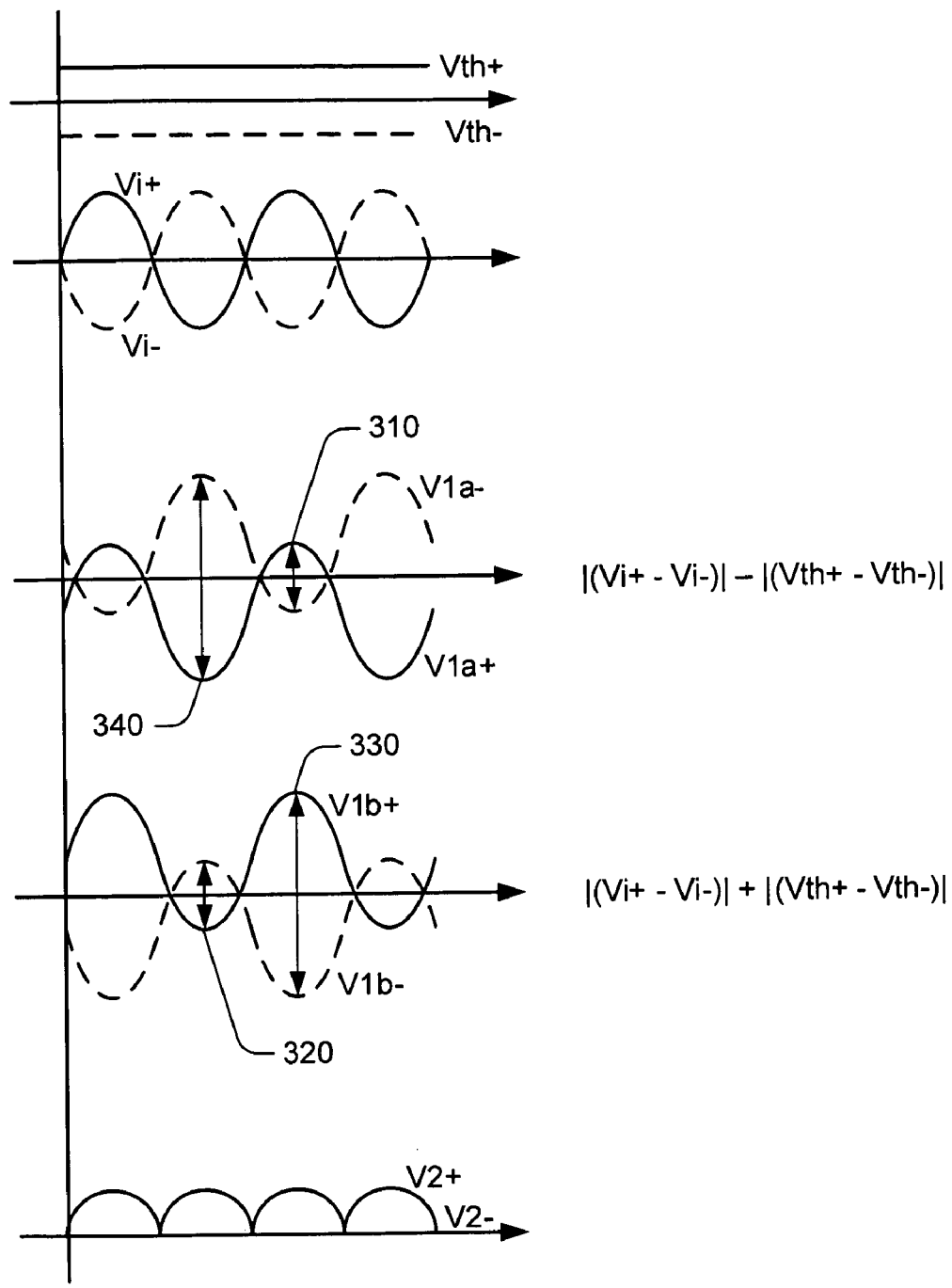
FIG. 3 shows a diagram of various signals within the exemplary squelch detector.

FIG. 2 shows an exemplary implementation of a squelch detector 200 that differentially detects a presence of a communication signal on a communication channel. The squelch detector 200 includes a differential offset biasing amplifier 210, a differential self-mixer 220 coupled to the differential offset biasing amplifier 210, and a differential comparator 240 coupled to the differential self-mixer 220. The squelch detector 200 may further include a differential gain stage 230 coupled between the differential self-mixer 220 and the differential comparator 240. The squelch detector 200 is further described herein with reference to FIG. 3, which illustrates exemplary signal processing that may be performed at various stages of the squelch detector 200.

The differential offset biasing amplifier 210 receives a differential input signal $V_i = (V_{i+} - V_{i-})$ at a first set of differential input terminals and a differential squelch detection threshold signal $V_{th} = (V_{th+} - V_{th-})$ at a second set of differential input terminals. The differential offset biasing amplifier 210, in the illustrated example, may be fully differential and includes a first differential circuit 212 and a second differential circuit 214. In operation, the first differential circuit 212 subtracts the differential squelch detection threshold signal $(V_{th+} - V_{th-})$ from the differential input signal $(V_{i+} - V_{i-})$ to generate a first differential offset biased signal $(V_{1a})$. Subtracting the differential squelch detection threshold signal $(V_{th+} - V_{th-})$ from the differential input signal $(V_{i+} - V_{i-})$ implements positive peak detection, as illustrated at 310 in FIG. 3. The second differential circuit 214 adds the differential squelch detection threshold signal $(V_{th+} - V_{th-})$ to the differential input signal $(V_{i+} - V_{i-})$ to generate a second differential offset biased signal $(V_{1b})$. Adding the differential squelch detection threshold signal $(V_{th+} - V_{th-})$ to the input differential signal $(V_{i+} - V_{i-})$ implements negative peak detection, as illustrated at 320 in FIG. 3. Each differential circuit 212, 214 may also provide gain G as an integral function or the gain may be provided by a separate gain circuit 216, 218. Thereafter, the differential offset biased signals $(V_{1a}, V_{1b})$, are output by the differential offset biasing amplifier 210.

The differential self-mixer 220 receives the differential offset biased signals $(V_{1a}, V_{1b})$ at its input terminals. The differential self-mixer 220, in this example, is fully differential and selectively passes and mixes the detected positive and negative peaks from the differential offset biased signals and down converts the signal directly to a differential direct current signal $(V_2)$. Thereafter, the differential direct current signal $(V_2)$ is output by the differential self-mixer 220.

The differential gain stage 230 in this example is utilized to further amplify the differential direct current signal $(V_2)$ output by the differential self-mixer 220, when increased signal amplitude is desired by the application. The differential gain stage 230 amplifies the differential direct current signal $(V_2)$ by the gain K. Thereafter, the amplified differential direct current signal $(V_3)$ is output by the differential gain stage 230.

The differential comparator 240 receives the amplified differential direct current signal $(V_3)$ at its differential input. The differential comparator 240 converts the amplified differential direct current signal ($V_3$) to a digital squelch signal ($V_o$). For example, when the potential of the amplified differential direct current signal ($V_3$) is greater than zero, the differential comparator outputs a squelch signal ($V_o$) having a first logic level. When the potential of the differential direct current signal ($V_3$) is substantially zero, the differential comparator outputs a squelch signal ($V_o$) having a second logic level. Thereafter, the squelch signal ($V_o$) is output by the differential comparator 240.

Accordingly, in this implementation, when the peak-to-peak potential of the differential input signal ($V_i$) is greater than the potential of the differential squelch detection threshold signal ($V_{th}$), the squelch signal ($V_o$) is output at a first logic level (e.g., high). When the peak-to-peak potential of the differential input signal ($V_i$) is less than the potential of the differential squelch detection threshold signal ($V_{th}$) 310, 330, the squelch signal ($V_o$) is output at a second logic level (e.g., low). In this way, the squelch signal ($V_o$) indicates if a transmission signal is present on the communication channel.

The squelch detector 200 in this example is fully differential. The fully differential architecture of the squelch detector 200 is insensitive to common mode noise, tolerant of substantial device mismatch and variations in the process-voltage-temperature (PVT) corner. Thus, the squelch detector 200 may improve the accuracy of squelch detection, yet employ a similar layout area and power dissipation when compared to conventional squelch detectors 400. The architecture of the squelch detector 200 is also scalable as a result of its low sensitivity to the link speed of the communication channel.

Exemplary Circuits

Figure 4:
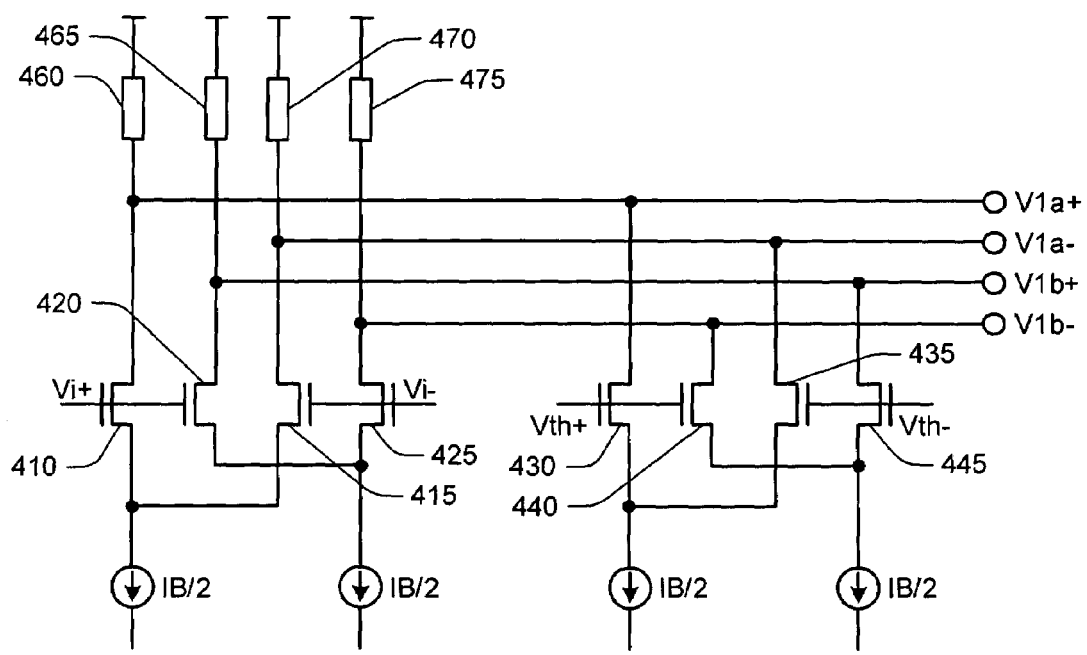
FIG. 4 shows a circuit diagram of a fully differential offset biasing amplifier in an exemplary implementation.

FIG. 4 shows an exemplary implementation of the differential offset biasing amplifier 210 of FIG. 2. The differential offset biasing amplifier 210 includes a first transistor 410 and a second transistor 415 that are coupled to form a first differential pair. Likewise, the differential offset biasing amplifier 210 includes a third transistor 420 and fourth transistor 425 coupled to form a second differential pair. Further, the differential offset biasing amplifier 210 also includes a fifth transistor 430 and sixth transistor 435 coupled to form a third differential pair, and a seventh transistor 440 and eighth transistor 445 coupled to form a fourth differential pair.

In an exemplary implementation, the transistors of the differential pairs 410, 415, 420, 425, 430, 435, 440, 445 are metal-oxide-semiconductor field effect transistors (MOSFET). The MOSFETs may be enhancement mode or depletion mode devices and may be n-channel or p-channel devices. In addition, those skilled in the art should appreciate that the differential pairs 410, 415, 420, 425, 430, 435, 440, 445 may be implemented using a variety of other types of transistors, such as junction field effect transistors, bipolar junction transistors or the like. The loads 460, 465, 470, 475 of the differential pairs may be resistive elements, inductive elements, transistors configured as active loads, or the like.

In general, a differential pair is biased by a current source. When the potential at the input terminals of the differential pair (e.g., the gates of the transistors) is equal, the bias current flows in substantially equal amounts through the channel of each transistor. Accordingly, the potential drop across each load is substantially equal and therefore the output potential (e.g., across the sources of the transistors) is substantially zero.

As the potential at the gate of one of the transistors increases relative to the gate of the other transistor, the current through the corresponding transistor increases and the current through the other transistor decreases in substantially equal amounts. Accordingly, the potential drop across each load changes, which results in an output potential that is proportional to the potential difference at the input terminals of the differential pair.

In operation, the first differential pair 410, 415 receives the differential input signal ($V_{i+}-V_{i-}$) at its input terminals and the third differential pair 430, 435 receives the differential squelch detection threshold signal ($V_{th+}-V_{th-}$) at its input terminals. The outputs of the first differential pair 410, 415 and third differential pair 430, 435 are coupled together such that the differential squelch detection threshold signal ($V_{th+}-V_{th-}$) is subtracted from the differential input signals ($V_{i+}-V_{i-}$). Similarly, the second differential pair 420, 425 receives the differential input signal ($V_{i+}-V_{i-}$) at its input terminals and the fourth differential pair 440, 445 receives the differential squelch detection threshold signal ($V_{th+}-V_{th-}$) at its input terminals. The outputs of the second differential pair 420, 425 and fourth differential pair 440, 445 are coupled together such that the differential squelch detection threshold signal ($V_{th+}-V_{th-}$) is added to the differential input signals ($V_{i+}-V_{i-}$).

Thus, the coupled first differential pair 410, 415 and third differential pair 430, 435 provide positive peak detection by subtracting the differential squelch detection threshold signal ($V_{th+}-V_{th-}$) from the differential input signal ($V_{i+}-V_{i-}$). The coupled second differential pair 420, 425 and fourth differential pair 440, 445 provide negative peak detection by adding the differential squelch detection threshold signal ($V_{th+}-V_{th-}$) to the differential input signal ($V_{i+}-V_{i-}$).

Figure 5:
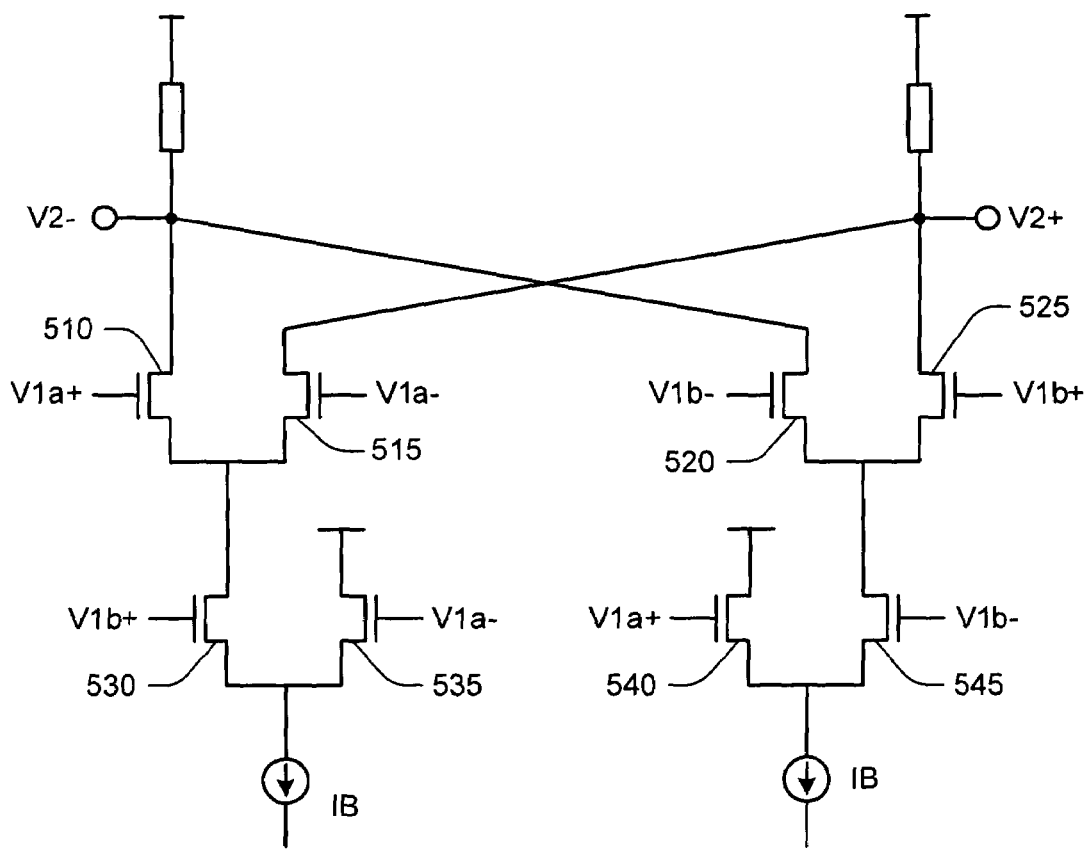
FIG. 5 shows a circuit diagram of a fully differential self-mixer in an exemplary implementation.

FIG. 5 shows an exemplary implementation of the differential self-mixer 220 of FIG. 2. The differential self-mixer 220 includes first and second transistors 510, 515 coupled to form a first differential pair, and third and fourth transistors 520, 525 coupled to form a second differential pair. The differential self-mixer 220 also includes fifth and sixth transistors 530, 535 coupled to form a third differential pair, and seventh and eighth transistors 540, 545 coupled to form a fourth differential pair.

The first differential pair 510, 515 receives the first differential offset biased signal ($V_{1a+}, V_{1a-}$) and the second differential pair 520, 525 receives the second offset biased differential signal ($V_{1b+}, V_{1b-}$). The third differential pair 530, 535 is coupled in series with the first differential pair 510, 515. The fourth differential pair 540, 545 is coupled in series with the second differential pair 520, 525. The outputs of the first differential pair 510, 515 and second differential pair 520, 525 are coupled together such that the positive and negative peaks from the differential offset biased signals ($V_{1a}, V_{1b}$), that correspond to when the potential difference of the input signal ($V_i$) exceeds the potential difference of the squelch detection threshold signal ($V_{th}$), are selectively passed, mixed and down converted directly to a direct current signal ($V_2$).

In particular, the third differential pair 530, 535 selectively provides the bias current IB to the first differential pair 510, 515 when the first side of the second differential offset biased signal ($V_{1b+}$) is greater than the second side of the first differential offset biased signal ($V_{1a-}$). Thus, the relatively small peaks of $V_{1a}$ 310 are selectively passed to the output during the relatively large peaks of $V_{1b}$ 330. Similarly, the fourth differential pair 540, 545 selectively provides the bias current IB to the second differential pair 520, 525 when the second side of the second differential offset biased signal ($V_{1b-}$) is greater than the first side of the first differential offset biases signal ($V_{1a+}$). Likewise, the relatively small peaks 320 of $V_{1b}$ are selectively passed to the output during the relatively large peaks 340 of $V_{1a}$.

The differential self-mixer 220 advantageously improves the dynamic range of the squelch detection signal, as compared to conventional squelch detectors. The direct conversion of the detected peaks to direct current also allows implementation of high gain amplifying using a single gain stage with low bias current in the differential gain stage 230, resulting in a reduction in power consumption and layout area in devices.

Exemplary Methods

The following describes a squelch detection method that may be implemented utilizing the previously described systems, devices and/or circuits. The method is shown as a set of processes performed by one or more devices and/or circuits and is not necessarily limited to the order shown for performing the operations.

Figure 6:
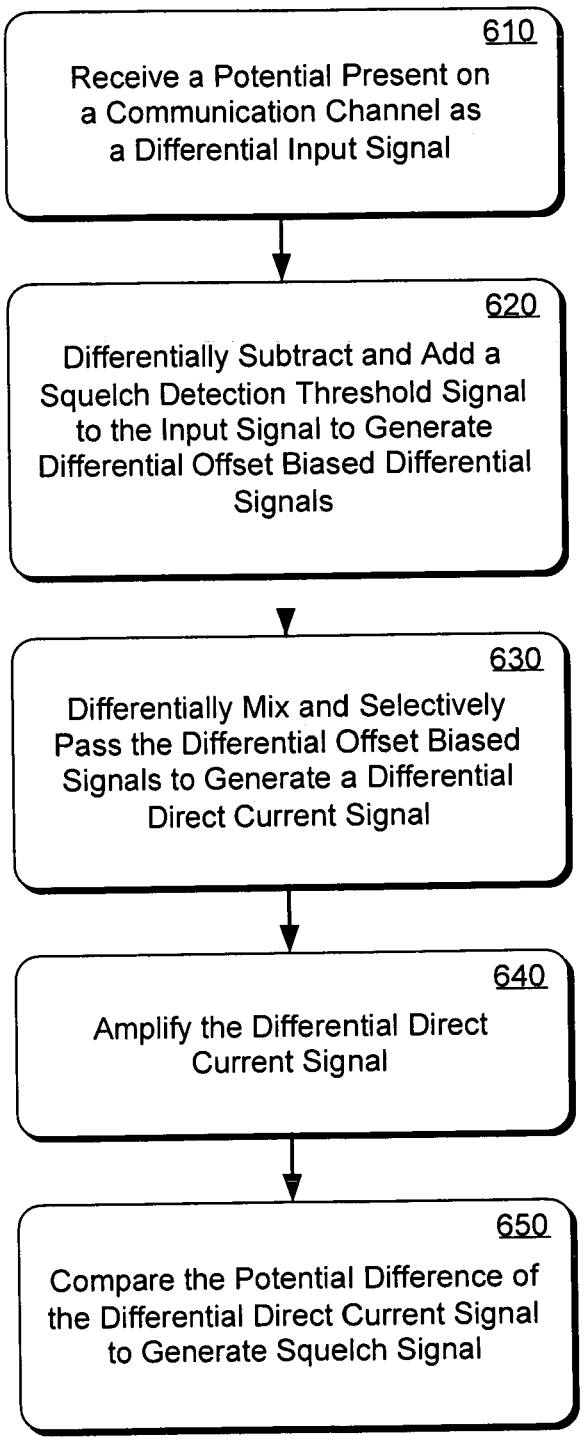
FIG. 6 shows a flow diagram of a squelch detection method in an exemplary implementation.

FIG. 6 shows an exemplary squelch detection method 700 that differentially detects the presence of a communication signal on the communication channel. The method includes receiving a potential difference present on a communication channel as a differential input signal ($V_i$), at 610. At 620, differential offset biased signals ($V_{1a}$, $V_{1b}$) are generated as a function of the differential input signal ($V_i$) and a differential squelch detection threshold signal ($V_{th}$). The differential squelch detection threshold signal ($V_{th}$) is fully differentially subtracted from and added to the differential input signal ($V_i$) to generate differential offset biased signals ($V_{1a}$, $V_{1b}$). In particular, the magnitude of the squelch detection threshold signal ($V_{th}$) is subtracted from the magnitude of the input signal ($V_i$) to generate a first differential offset biased signal ($V_{1a}=|(V_{i+}-V_{i-})|-|(V_{th+}-V_{th-})|$). The differential squelch detection threshold signal ($V_{th}$) is added to the magnitude of the differential input signal ($V_i$) to generate a second differential offset biased signal ($V_{1b}=|(V_{i+}-V_{i-})|+|(V_{th+}-V_{th-})|$).

A differential direct current signal ($V_2$) is generated as a function of the differential offset biased signals ($V_{1a}$, $V_{1b}$), at 630. The differential offset biased signals ($V_{1a}$, $V_{1b}$) are fully differentially mixed and selectively passed, thereby down converting the signals directly to a differential direct current signal ($V_2$). In particular, the positive and negative peaks from the differential offset biased signals ($V_{1a}$, $V_{1b}$) corresponding to when the potential difference of the differential input signal ($V_i$) exceeds the potential difference of the differential squelch detection threshold signal ($V_{th}$) are selectively passed and mixed together.

The differential direct current signal ($V_2$) may be amplified to increase the signal amplitude, at 640. At 650, a squelch signal ($V_o$) is generated as a function of the differential direct current signal ($V_2$). In particular, the potential difference of the amplified differential direct current signal ($V_3$) is differentially compared to convert the potential difference of the amplified differential direct current signal ($V_3$) to a digital squelch signal ($V_o$).

Accordingly, if the peak-to-peak potential of the differential input signal ($V_i$) is greater than the differential squelch detection threshold signal ($V_{th}$), the squelch signal ($V_o$) is output at a first logic level (e.g., high) indicating that a transmission signal is present on the communication channel. If the peak-to-peak potential of the differential input signal ($V_i$) is less than the differential squelch detection threshold signal ($V_{th}$) 310, 330, the squelch signal ($V_o$) is output at a second logic level (e.g., low) indicating that a transmission signal is not present on the communication channel.

The squelch detection signal ($V_o$) can be utilized in a variety of ways, for example to power down unused circuits (e.g., the receiver circuit and/or core circuits). Consequently, power consumption by a device or system which utilizes this technique can be reduced when a signal is not present on the communication channel.

Conclusion

Although squelch detection techniques have been described in language specific to structural features and/or methods, it is to be understood that the subject of the appended claims is not necessarily limited to the specific features or processes described. Rather, the specific features and processes are disclosed as exemplary implementations of squelch detection techniques.

What is claimed is:

1. A squelch detector comprising:
   a differential offset bias amplifier to receive a differential input signal and a differential squelch detection threshold signal and output differential offset biased signals;
   a differential self-mixer to receive the differential offset biased signals and output a differential direct current signal; and
   a differential comparator to receive the differential direct current signal and output a squelch signal.

2. A squelch detector as recited in claim 1, wherein the differential offset biased signals comprise a first differential biased offset signal and a second differential biased offset signal.

3. A squelch detector as recited in claim 2, wherein the differential offset bias amplifier comprises:
   a first differential pair coupled to receive the differential input signal;
   a second differential pair coupled to receive the differential input signal;
   a third differential pair coupled to receive the differential squelch detection threshold signal and having an output coupled to an output of the first differential pair to generate the first differential offset biased signal; and
   a fourth differential pair coupled to receive the differential squelch detection threshold signal and having an output coupled to an output of the second differential pair to generate the second differential offset biased signal.

4. A squelch detector as recited in claim 2, wherein:
   the first differential offset biased signal comprises a difference between a magnitude of a potential difference of the differential input signal and a magnitude of a potential difference of the differential squelch detection threshold signal; and
   the second differential offset biased signal comprises a sum of the magnitude of the potential difference of the differential input signal and the magnitude of the potential difference of the differential squelch detection threshold signal.

5. A squelch detector as recited in claim 1, wherein the differential offset bias amplifier is to fully differentially combine the differential input signal and the differential squelch detection threshold signal to generate the differential offset biased signals.

6. A squelch detector as recited in claim 1, wherein the differential self-mixer is to selectively pass and mix the differential offset bias signals to generate the differential direct current signal.

7. A squelch detector as recited in claim 1, wherein the differential self-mixer comprises:
   a first differential pair coupled to receive a first differential offset biased signal;
   a second differential pair coupled to receive a second differential offset biased signal and having an output coupled to an output of the first differential pair to generate the differential direct current signal;

a third differential pair coupled to selectively provide a bias current to the first differential pair when a potential of a first side of the second differential offset biased signal is greater than a potential of a second side of the first differential offset biased signal; and a fourth differential pair coupled to selectively provide the bias current to the second differential pair when a potential of a second side of the second differential offset biased signal is greater than a potential of a first side of the first differential offset biased signal.

8. A squelch detector as recited in claim 1, wherein the differential self-mixer is to fully differentially pass and mix the differential offset bias signals to generate the differential direct current signal.

9. A squelch detector as recited in claim 1, wherein the differential comparator is to convert a potential difference of the differential direct current signal to the squelch signal.

10. A squelch detector as recited in claim 1, further comprising a differential gain stage to amplify the differential direct current signal before receipt by the differential comparator.

11. A system comprising:
a communication channel;
a wireless communication interface coupled to the communication channel; and
a squelch detector to fully differentially detect a presence of a communication signal on the communication channel, wherein the squelch detector comprises:
a differential offset bias amplifier coupled to receive a potential on the communication channel as a differential input signal, and having a first differential circuit to subtract a differential squelch detection threshold signal from the differential input signal to generate a first differential offset biased signal, and a second differential circuit to add the differential squelch detection threshold signal to the differential input signal to generate a second differential offset biased signal;
a differential self-mixer coupled to the differential offset bias amplifier to differentially pass and mix the first differential offset biased signal and the second differential offset biased signal to generate a differential direct current signal; and
a differential comparator coupled to the differential self-mixer to convert the differential direct current signal to a squelch signal.

12. The system as recited in claim 11, wherein the differential offset bias amplifier comprises:
a first differential pair coupled to receive the differential input signal;
a second differential pair coupled to receive the differential input signal;
a third differential pair coupled to receive the differential squelch detection threshold signal and having an output coupled to an output of the first differential pair; and
a fourth differential pair coupled to receive the differential squelch detection threshold signal and having an output coupled to an output of the second differential pair.

13. A system as recited in claim 12, wherein the differential self-mixer comprises:
a first differential pair coupled to receive a first differential offset biased signal;
a second differential pair coupled to receive a second differential offset biased signal and having an output coupled to an output of the first differential pair;

a third differential pair coupled to selectively provide a bias current to the first differential pair when a potential of a first side of the second differential offset biased signal is greater than a potential of a second side of the first differential offset biased signal; and a fourth differential pair coupled to selectively provide the bias current to the second differential pair when a potential of a second side of the second differential offset biased signal is greater than a potential of a first side of the first differential offset biased signal.

14. A system as recited in claim 11, wherein the squelch signal comprises:
a first logic level if a potential difference of the differential input signal is greater than a potential difference of the differential squelch detection threshold signal; and
a second logic level if the potential difference of the differential input signal is less than the potential difference of the differential squelch detection threshold signal.

15. A system as recited in claim 11, wherein the squelch detector further comprises a differential gain stage to amplify the differential direct current signal before receipt by the differential comparator.

16. A system as recited in claim 15, wherein the differential gain stage comprises a single gain stage amplifier.

17. A method of detecting a communication signal comprising:
receiving a potential on a communication channel as a differential input signal;
generating a first differential offset biased signal and a second differential offset biased signal as a function of the differential input signal and a squelch detection threshold signal;
generating a differential direct current signal as a function of the first differential offset biased signal and the second differential offset biased signal; and
generating a squelch signal as a function of the differential direct current signal.

18. A method according to claim 17, wherein:
generating the first differential offset biased signal comprises fully differentially subtracting the differential squelch detection threshold signal from the differential input signal; and
generating the second differential offset biased signal comprises fully differentially adding the differential squelch detection threshold signal to the differential input signal.

19. A method according to claim 17, wherein generating the differential direct current signal comprises fully differentially mixing and selectively passing the first differential offset biased signal and the second differential offset biased signal.

20. A method according to claim 19, wherein fully differentially mixing and selectively passing the first differential offset biased signal and the second differential offset biased signal comprises selectively passing and mixing the positive and negative peaks of the first differential offset biased signal and the second differential offset biased signal that corresponds to when the potential difference of the differential input signal exceeds the potential difference of the differential squelch detection threshold signal.

21. A method according to claim 17, wherein generating the squelch signal comprises converting the potential difference of the differential direct current signal to a digital squelch signal.

* * * * *